(12) United States Patent
Sejersen et al.

(10) Patent No.: US 8,011,807 B2
(45) Date of Patent: Sep. 6, 2011

(54) METHOD FOR ENABLING TRANSMISSION OF SUBSTANTIALLY EQUAL AMOUNTS OF ENERGY

(75) Inventors: Niels Borgbjerg Sejersen, Hornslet (DE); Niels Holm Larsen, Allchwill (CH); Henrik Glent-Madsen, Låsby (DK)

(73) Assignee: Sign-Tronic AG, Widnau (CH)

( * ) Notice: Subject to any disclaimer, the term of this patent is extended or adjusted under 35 U.S.C. 154(b) by 1045 days.

(21) Appl. No.: 11/568,520

(22) PCT Filed: May 5, 2004

(86) PCT No.: PCT/DK2004/000309
§ 371 (c)(1),
(2), (4) Date: Jul. 9, 2007

(87) PCT Pub. No.: WO2005/106588
PCT Pub. Date: Nov. 10, 2005

(65) Prior Publication Data
US 2007/0284547 A1 Dec. 13, 2007

(51) Int. Cl.
*F21S 8/00* (2006.01)
*F21S 6/00* (2006.01)
*G06F 15/00* (2006.01)
*G02B 26/00* (2006.01)

(52) U.S. Cl. ......... 362/281; 362/257; 362/283; 358/1.7; 430/296; 235/462.41; 347/238; 359/290

(58) Field of Classification Search .......... 359/237–239, 359/290–297; 430/296–299; 235/462.41; 358/1.7; 347/238; 362/257–296.1, 281
See application file for complete search history.

(56) References Cited

U.S. PATENT DOCUMENTS
2002/0153362 A1 10/2002 Sandstrom et al.
2003/0037878 A1 2/2003 Kotoku

FOREIGN PATENT DOCUMENTS
WO WO 2004021269 3/2004
WO WO 2005/106588 * 11/2005

* cited by examiner

*Primary Examiner* — Evelyn A. Lester
(74) *Attorney, Agent, or Firm* — Price Heneveld LLP

(57) ABSTRACT

The invention relates to a method for enabling transmission of substantially equal amounts of energy from at least one light source (LS) comprising intensity variations in time to at least two light sensitive points (LSP), said transmission being controlled by means of at least one illumination arrangement (1), and said method comprising establishment of a correlation between said intensity variations and at least one feature of said illumination arrangement. The invention furthermore relates to an illumination arrangement (1) for controlling transmission of energy to at least two light sensitive points (LSP), wherein said controlling transmission enables transmission of substantially equal amounts of energy to each of said at least two light sensitive points (LSP).

19 Claims, 9 Drawing Sheets

METHOD FOR ENABLING TRANSMISSION OF SUBSTANTIALLY EQUAL AMOUNTS OF ENERGY

FIELD OF THE INVENTION

The present invention relates to enablement of transmission of substantially equal amounts of energy to at least two light sensitive points, in the context of illumination arrangements comprising light sources with varying intensity.

BACKGROUND OF THE INVENTION

In several technical fields, illumination is either the main purpose or is used as a tool for obtaining desired results. Applications comprise, e.g., image and movie projection, photolithography, computer-to-plate applications, serigraphy, other photographical applications such as production of printed circuit boards, etc., photolysis, rapid prototyping, rapid manufacturing, communication, and several others.

Numerous categories and types of light sources exist for illumination purposes, each manufactured with different purposes in view and often constrained to neglect other purposes. Purposes of interest may be power rating, luminous efficacy, stability of the luminous intensity, precision of the point of emission, color rendering, etc. For example, short arc lamps, i.e., high-pressure discharge lamps, are used in many applications because they may offer high power ratings, high luminous efficacy, excellent color rendering and a very small point of emission. Unfortunately, their construction, however, also causes displacement of material from the electrodes, causing their voltage ratings to change during use, their lifetime to be reduced, and the point of emission, i.e., the arc, to fluctuate. These problems are well known within the art and are addressed in several ways, some of which include the use of alternating driving current and/or frequent current peaking. Often such solutions introduce new problems and in the example of short arc lamps, the current peaking causes the emitted luminous intensity to fluctuate.

Of the above mentioned illumination applications, several do accept light sources establishing light beams having fluctuating luminous intensity and/or fluctuating point of emission, either because they are intended for use in low-quality products, or because the fluctuations may be considered insignificant for a specific use. For example, for use in movie projectors, a slightly fluctuating luminous intensity may be acceptable as the light beam is used to illuminate the same area continuously, for which reason the human eye may not be able to recognize the changes and, furthermore, the projected images are changed at a fast pace. Such fluctuations may, however, not be acceptable for specific uses of a high quality projector.

In fields as, e.g., photolithography and other techniques where the region to be exposed is only illuminated little by little, fluctuations of the luminous intensity may, however, be considered hazardous. This is because different regions of the exposed medium, e.g., a printing plate, are illuminated in turn, which makes it possible for one region to be illuminated with one level of intensity and the adjacent region to be illuminated with another. This may cause the result to look inconsistent and the probable periodicity of the intensity changes may even cause stripes or other visible periodical patterns to occur.

One of several objects of the present invention is to establish compensation means for facilitating the use of light sources with varying luminous intensity, e.g., short arc lamps with additional intensity at the supply peaking times, in applications where typically only constant intensity lamps are used.

One of several objects of the present invention is to establish means that adapt to real-time changes in the level of periodically occurring additional luminous intensity in a light beam and thus facilitate compensation in order to utilize such a light beam in applications where typically only constant intensity light beams are used.

One of several objects of the present invention is to facilitate an improved uniform light transmission via a spatial light modulator, such as, e.g., a DMD-modulator.

SUMMARY OF THE INVENTION

The invention relates to a method for enabling transmission of substantially equal amounts of energy from at least one light source LS comprising intensity variations in time to at least two light sensitive points LSP, said transmission being controlled by means of at least one illumination arrangement 1, and said method comprising establishment of a correlation between said intensity variations and at least one feature of said illumination arrangement.

According to the present invention, disadvantages of using light sources with varying intensity, e.g., short arc lamps with peaking power supply, may be overcome, and in a preferred embodiment even in such a way that the peak intensities are utilized for optimum efficiency.

According to the present invention, energy is transmitted to light sensitive points by accumulation of light intensity over time. Control of the energy amount thus basically comprises control of the intensity and time of exposure.

The light originating from light sources according to the present invention may comprise intensities that vary in time, i.e., flickers, probably at a rate not perceptible by a human eye, and/or in space, i.e., non-uniform intensity distribution. It is an object of the present invention to particularly address the disadvantages of time wise intensity variations.

In order to enable the use of peaking light sources and even utilizing the intensity variations, a correlation between the variations and the energy amount control means has to be present. Such correlation may, however, be established between the intensity variations and one or more of several controllable features of the illumination arrangement, or the correlation may even be established by controlling the intensity variations.

It is noted that the terms illumination arrangement and light modulating arrangement in the following are used for substantially the same kind of means.

When said intensity variations in time comprise substantially periodic intensity peaks, an advantageous embodiment of the present invention has been obtained.

According to the present invention, the intensity variations of the light source may comprise substantially periodic intensity peaks, as the lamp driver may intentionally cause such in order to prolong the lifetime of the lamp. As some lamp drivers may be controlled, it is, in some applications, possible to control the periodic intensity peaks, while still not possible to avoid them altogether.

When said at least one illumination arrangement 1 and said at least two light sensitive points LSP are moved relative to each other, and whereby said at least one feature of said illumination arrangement comprises characteristics of said relative movement, an advantageous embodiment of the present invention has been obtained.

According to the present invention, the illumination arrangement preferably travels relative to the light sensitive points in a direction parallel to a plane comprising the light sensitive points, i.e., a light sensitive medium. Thus, some of several features that may be controlled in order to establish the correlation with the peak timing are characteristics of the movement, e.g., speed and direction, and also the width of the light modulation layout, i.e., the number of light modulators in each row.

When said establishment of a correlation comprises adapting said characteristics of said relative movement into synchronism with said intensity variations in time, an advantageous embodiment of the present invention has been obtained.

According to the present invention, the movement characteristics, e.g., speed and direction, may be controlled in order to establish the correlation.

When said establishment of a correlation comprises adapting said intensity variations in time into synchronism with said characteristics of said relative movement, an advantageous embodiment of the present invention has been obtained.

According to the present invention, the intensity variations, e.g., periodic intensity peaks, may be controlled in order to establish the correlation with the movement characteristics, e.g., speed and direction.

When said synchronism between said intensity variations and said characteristics of said relative movement comprise an integer number of said periodic intensity peaks to occur during the illumination of each of said at least two light sensitive points, an advantageous embodiment of the present invention has been obtained.

According to the present invention, the correlation should preferably comprise an integer number of periodic intensity peaks occurring during the illumination of each light sensitive point. Thereby each light sensitive point may receive a substantially equal amount of energy.

When said illumination arrangement 1 comprises at least one light modulation means 3, and whereby said at least one feature of said illumination arrangement comprises characteristics of said light modulation means, an advantageous embodiment of the present invention has been obtained.

Characteristics of a light modulation means comprise, e.g., the current light modulation control information, the timing of the modulation, the spatial extent of the modulation, which light properties, e.g., intensity, frequency, etc., are modulated, etc. According to the present invention, such characteristics may be controlled in order to establish a correlation with the intensity variations of the light source.

When said at least one light modulation means 3 comprises at least one spatial light modulator comprising a plurality of light modulators LM, an advantageous embodiment of the present invention has been obtained.

The spatial light modulator used in a preferred embodiment of the present invention is a DMD-chip. It comprises a plurality of micro-mirrors, i.e., light modulators LM. Specific characteristics of a spatial light modulator comprising a plurality of light modulators comprise, e.g., which light modulators to enable or disable, individual enabling times for each light modulator, etc. According to the present invention, such characteristics may be controlled in order to establish a correlation with the intensity variations of the light source.

When said controlling of said transmission by means of said at least one illumination arrangement 1 comprises controlling said characteristics of said at least one light modulation means 3 at least partly on the basis of at least one modulation mask MM defining light modulators to be disabled, an advantageous embodiment of the present invention has been obtained.

According to the present invention, control of characteristics of the light modulating means is preferably achieved through the use of modulation masks. Such modulation masks may e.g., comprise information of forced states of certain light modulators, and may be loaded into the light modulating means by combining them with the utility image bitmap, thus establishing a composite bitmap to be loaded.

When said establishment of a correlation comprises adapting said at least one modulation mask MM so that said characteristics of said at least one light modulation means 3 is controlled in synchronism with said intensity variations in time, an advantageous embodiment of the present invention has been obtained.

According to the present invention, the modulation mask may be adapted in order to correlate to the intensity variations. Such adaptations may be predetermined or determined during exposure, and may comprise one lasting adaptation or several adaptations during exposure.

When said adaptation of said at least one modulation mask MM is performed continuously, an advantageous embodiment of the present invention has been obtained.

According to the present invention, the modulation mask is adapted continuously, in correlation with the intensity variations. The adaptations may comprise choosing between predetermined modulation masks from a bank of modulation masks, determining modulation mask settings on the fly, shifting a modulation mask to either side, etc. The adaptation may also comprise adaptive adjustments according to variations in the periodicity of the intensity variations.

When said adaptation of said at least one modulation mask MM comprises choosing a predefined modulation mask from a bank of modulation masks, an advantageous embodiment of the present invention has been obtained.

When said at least one modulation mask MM further comprises control information for avoiding non-uniform energy transmission due to intensity variations in space caused by said light modulation means or optical features of said illumination arrangement 1, an advantageous embodiment of the present invention has been obtained.

According to the present invention, the modulation mask may, in addition to establishing a correlation of illumination arrangement characteristics with the time wise intensity variations, preferably comprise information for handling spatial intensity variations.

When said establishment of a correlation comprises rearranging said control information in time, an advantageous embodiment of the present invention has been obtained.

According to the present invention, the spatial intensity variations handling information may be rearranged in time, i.e., by switching between different modulation masks comprising differently located control information, through time.

When said establishment of a correlation comprises rearranging said control information in space, an advantageous embodiment of the present invention has been obtained.

According to the present invention, the spatial intensity variations handling information may be rearranged in space, i.e., by shifting the control information to either side, randomizing the control information, etc.

The present invention further relates to an illumination arrangement 1 for controlling transmission of energy to at least two light sensitive points LSP, wherein said controlling transmission enables transmission of substantially equal amounts of energy to each of said at least two light sensitive points LSP, an advantageous embodiment of the present invention has been obtained.

According to the present invention, illumination arrangements may be enabled to transmit substantially equal amounts of energy to light sensitive points, thereby overcoming disadvantages of intensity varying light sources.

According to the present invention, an illumination arrangement, also referred to as a light modulating arrangement, preferably comprises means for establishing a light beam, modulating the light beam into a plurality of individually controlled light beams, and directing the light beams towards a light sensitive medium.

When said illumination arrangement comprises at least one light source LS, an advantageous embodiment of the present invention has been obtained.

When said at least one light source LS submits light comprising substantially periodic intensity variations, an advantageous embodiment of the present invention has been obtained.

According to the present invention, the driver of the light source may intentionally establish periodic intensity variations. By means of the present invention, the disadvantages of this often necessary evil may even be turned into more efficient illumination of light sensitive media.

When said illumination arrangement comprises at least one light modulation means 3, an advantageous embodiment of the present invention has been obtained.

When said at least one light modulation means 3 comprises at least one spatial light modulation means, an advantageous embodiment of the present invention has been obtained.

When said at least one spatial light modulation means 3 comprises a DMD-chip, an advantageous embodiment of the present invention has been obtained.

When said at least one spatial light modulation means 3 comprises a micro-mechanical shutter array, an advantageous embodiment of the present invention has been obtained.

When said illumination arrangement is moved relative to said at least two light sensitive points, an advantageous embodiment of the present invention has been obtained.

According to the present invention, the illumination arrangement preferably travels relative to the light sensitive points in a direction parallel to a plane comprising the light sensitive points, i.e., a light sensitive medium.

When said transmission of substantially equal amounts of energy to each of said at least two light sensitive points LSP is at least partly enabled by means of controlling said relative movement between said illumination arrangement and said at least two light sensitive points, an advantageous embodiment of the present invention has been obtained.

According to the present invention, equal amounts of energy may be ensured by characteristics of the movement, e.g., speed and direction, and also the width of the light modulation layout, i.e., the number of light modulators in each row.

When said controlling of said relative movement comprises synchronizing said relative movement with said period intensity variations, an advantageous embodiment of the present invention has been obtained.

According to the invention, the controlling of the movement, e.g., speed and direction, should preferably cause the movement to be synchronized with the intensity variations.

When said transmission of substantially equal amounts of energy to each of said at least two light sensitive points LSP is at least partly enabled by means of controlling said light modulation means 3, an advantageous embodiment of the present invention has been obtained.

According to the present invention, controlling the light modulation means may ensure the substantially equal amounts of energy. Features that may be controlled comprise, e.g., which light modulators to enable or disable and the enabling times of each light modulator. The controlling may furthermore comprise features such as intensity attenuation, wavelength filters, etc.

When said controlling said light modulation means 3 comprises applying at least one modulation mask MM, an advantageous embodiment of the present invention has been obtained.

According to the present invention, modulation masks are preferably used for controlling the light modulation means. A modulation mask may, e.g., comprise control information on each light modulator of the light modulation means, such as forced disabling or enabling of each light modulator. The modulation mask may preferably be loaded into the light modulation means by combining it with the utility bitmap to be exposed, and then loading the composite bitmap.

When said at least one modulation mask MM is established on the basis of characteristics of said periodic intensity variations, an advantageous embodiment of the present invention has been obtained.

According to the present invention, properties of a modulation mask is preferably determined on the basis of characteristics of the intensity variations, e.g., frequency, durations, etc. Thereby a correlation between the intensity variations and the control of the light modulating means may be established, allowing transmission of substantially equal amounts of energy.

When said at least one modulation mask MM further comprises control information for handling further disadvantages of said illumination arrangement, an advantageous embodiment of the present invention has been obtained.

According to the present invention, further disadvantages of the illumination arrangement may comprise limitations in the optical design, the light modulation means, among others, typically causing the light intensity distribution over the light modulation layout to be non-uniform, and furthermore typically causing non-linear or asymmetrical distortion in the edges and corners of the light modulation layout.

According to the present invention, the modulation masks may be established in such a way that both the time wise intensity variations as well as the further disadvantages of the illumination arrangement may be addressed.

When said controlling of said light modulation means 3 comprises rearranging said control information for handling further disadvantages, an advantageous embodiment of the present invention has been obtained.

According to the present invention, the controlling of the light modulation means comprises rearranging of the information for handling the further disadvantages. Thereby this control information is preserved, however in amended form, in order to address both problems.

When the illumination arrangement comprises means for carrying out the above-described method, an advantageous embodiment of the present invention has been obtained.

THE DRAWINGS

The invention will in the following be described with reference to the drawings where:

Figures 2A, 2B:
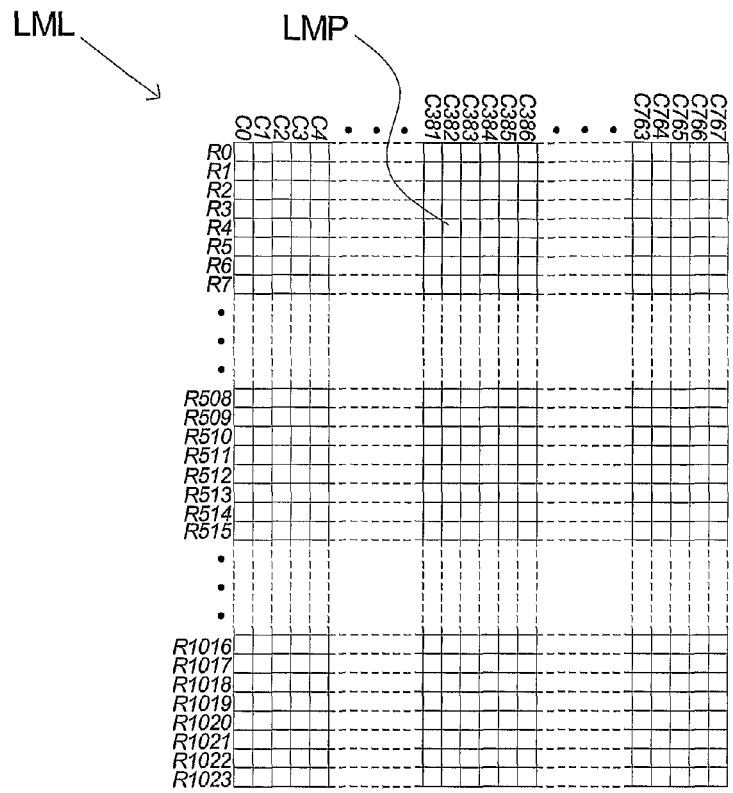
FIG. 2A illustrates an example of a light modulation layout.
Figure 3A:
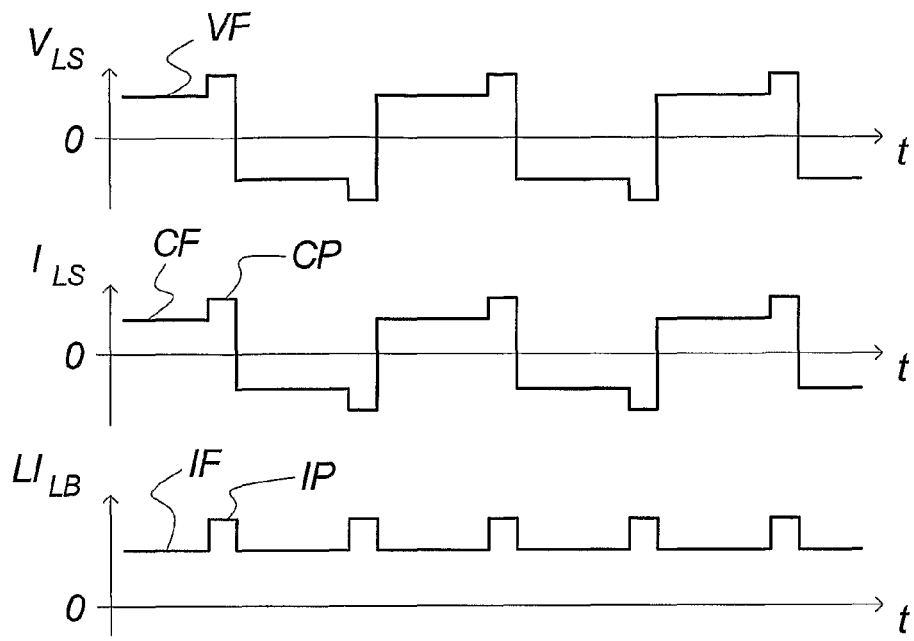
Figure 3B:
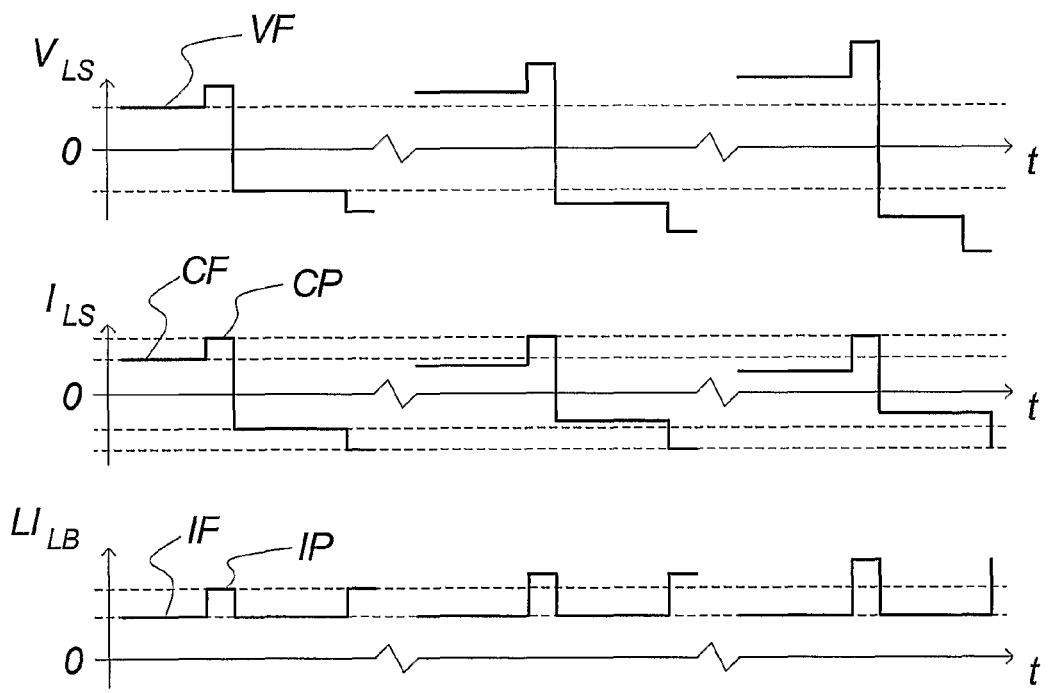
Figure 4:
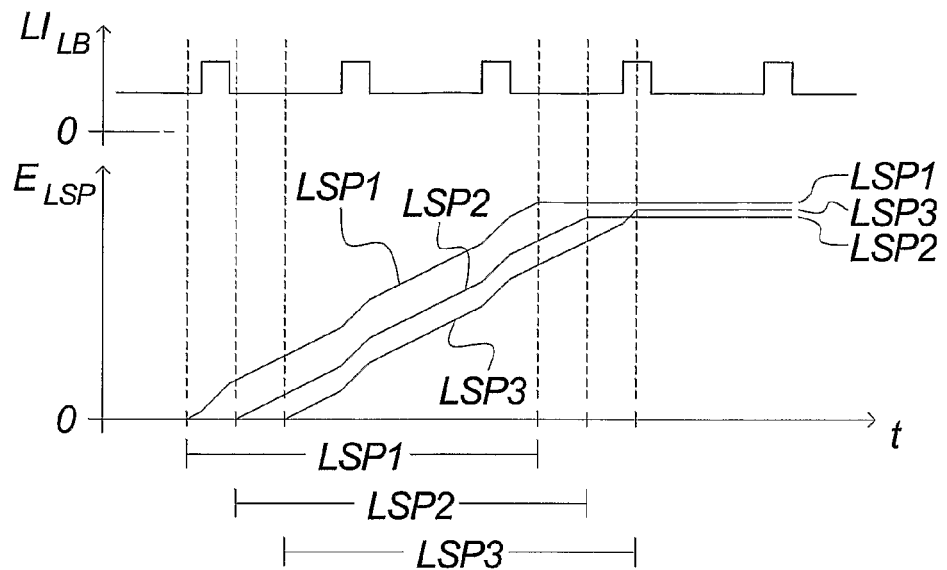
Figure 5:
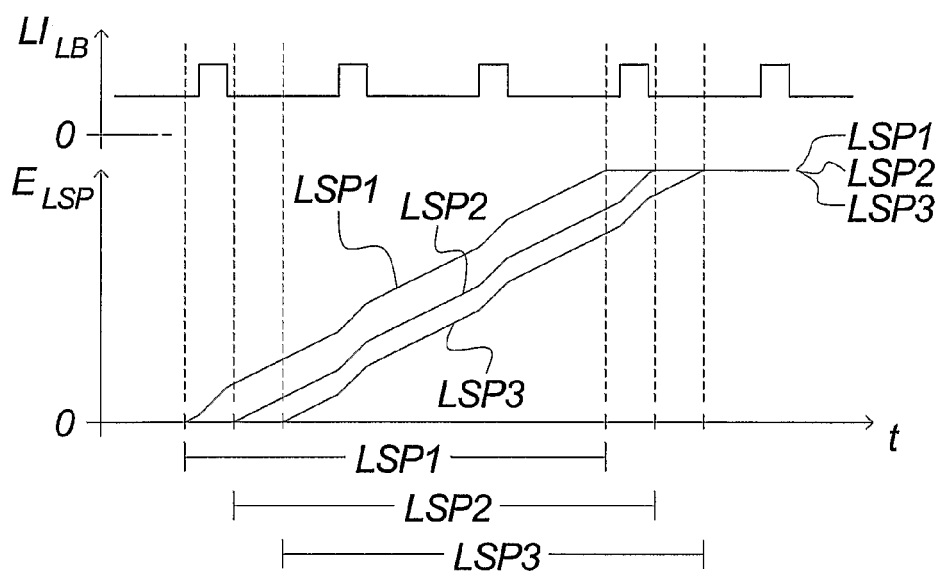
Figure 6:
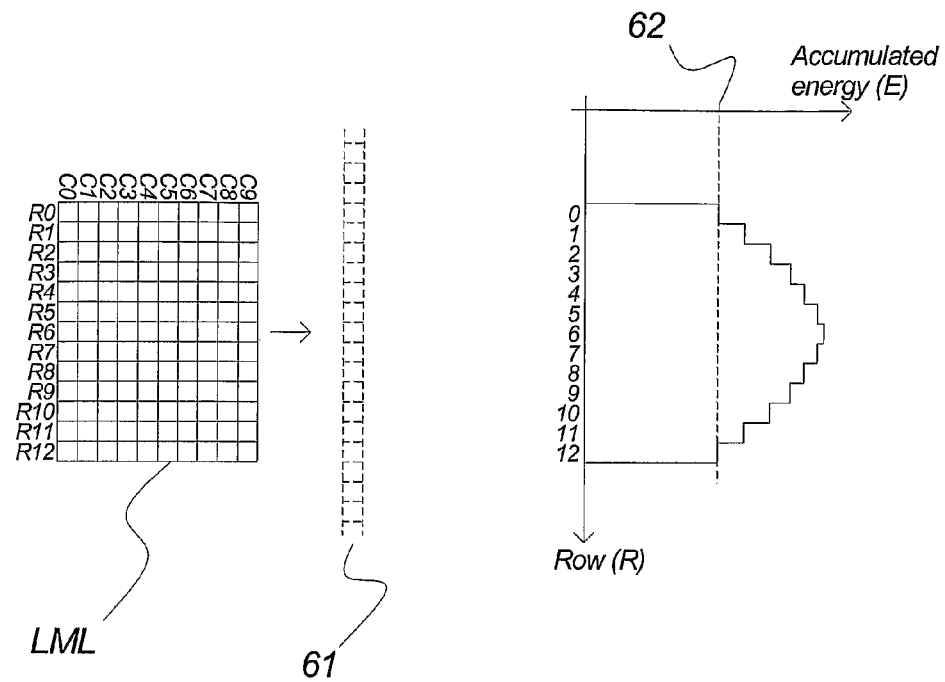
Figures 7A, 7B, 7C:
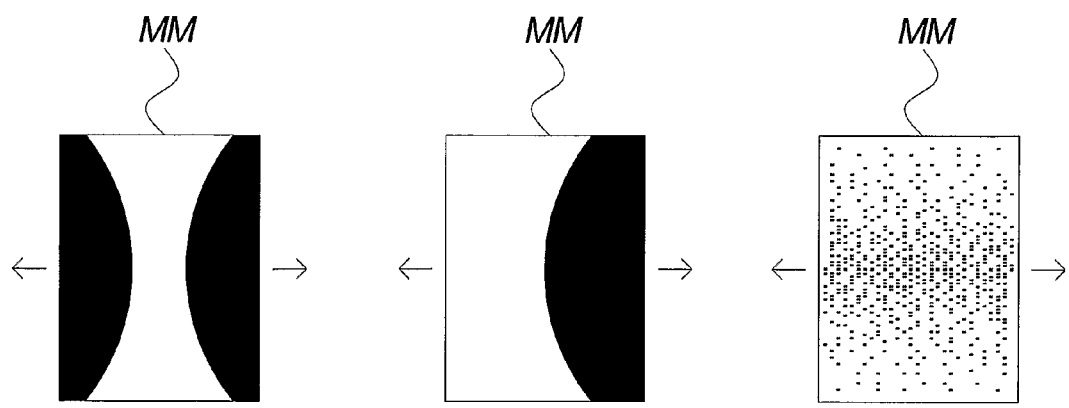
Figure 8A:
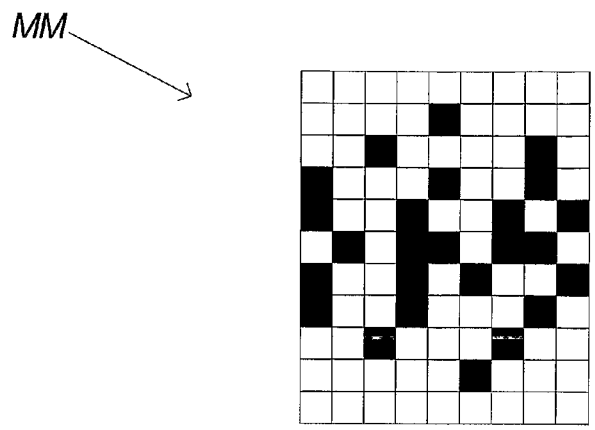
Figure 8B:
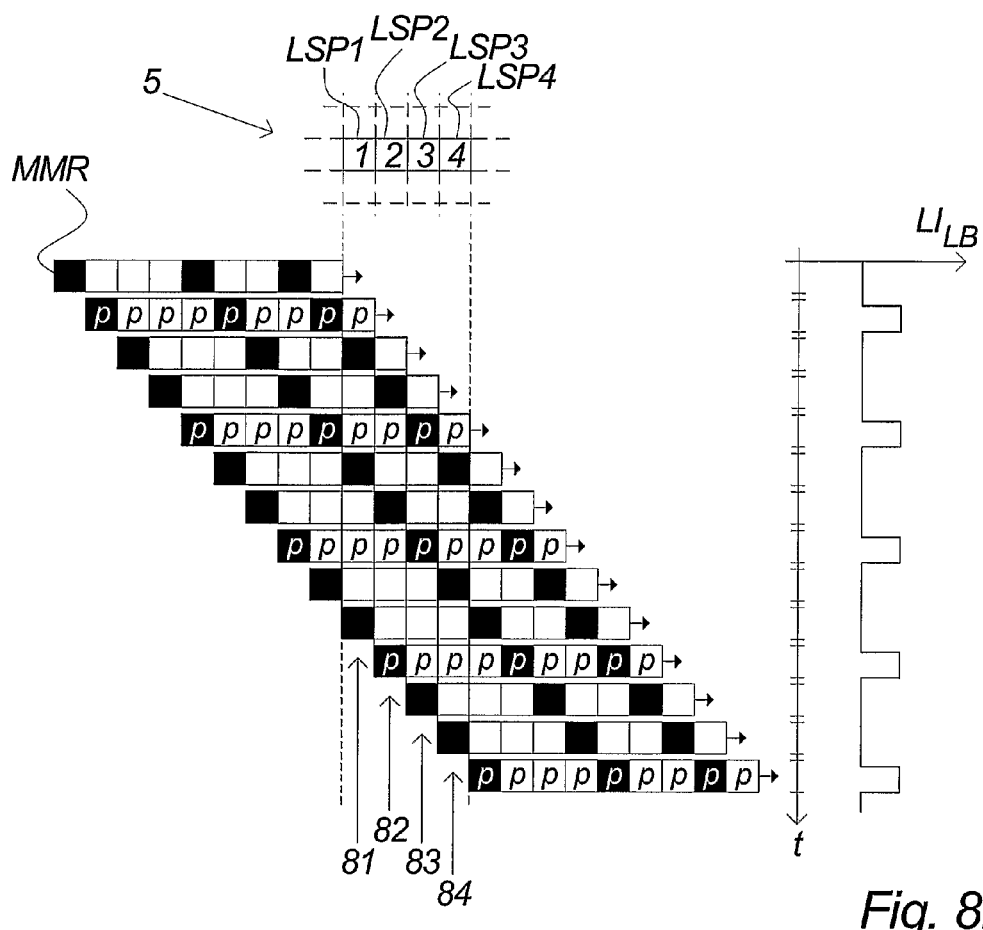
Figure 8C:
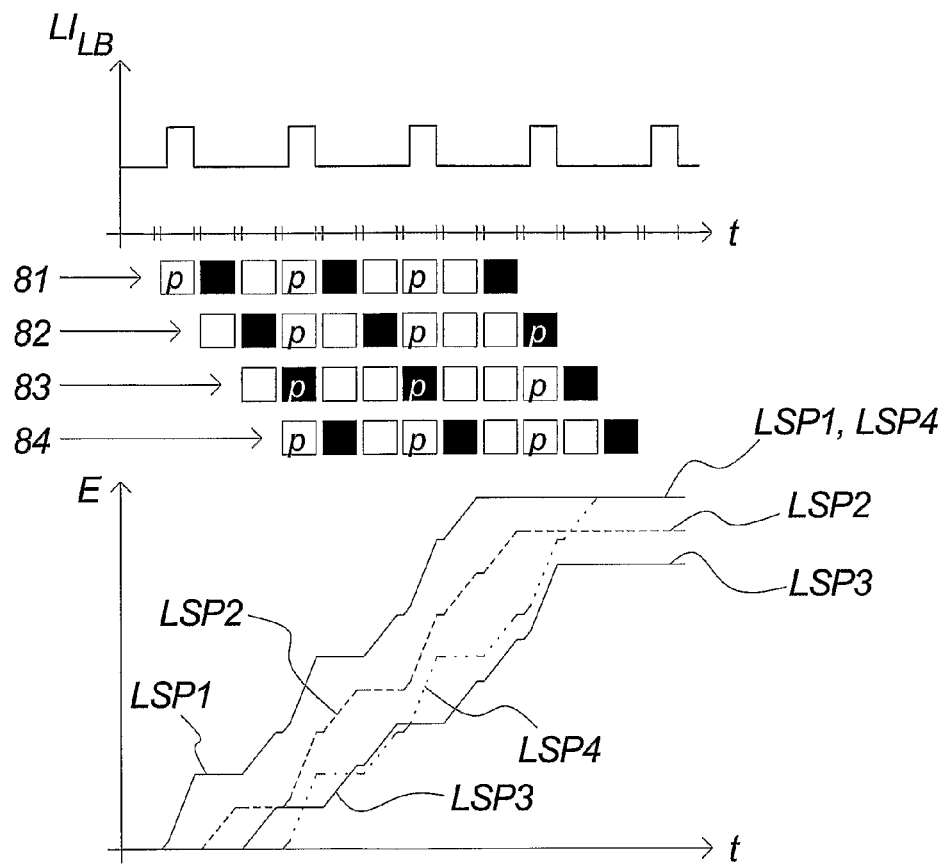
Figure 9A:
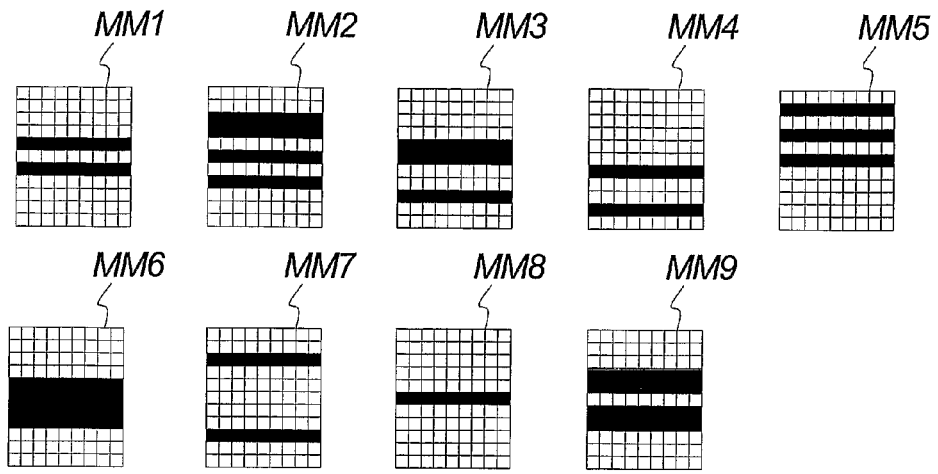
Figure 9B:
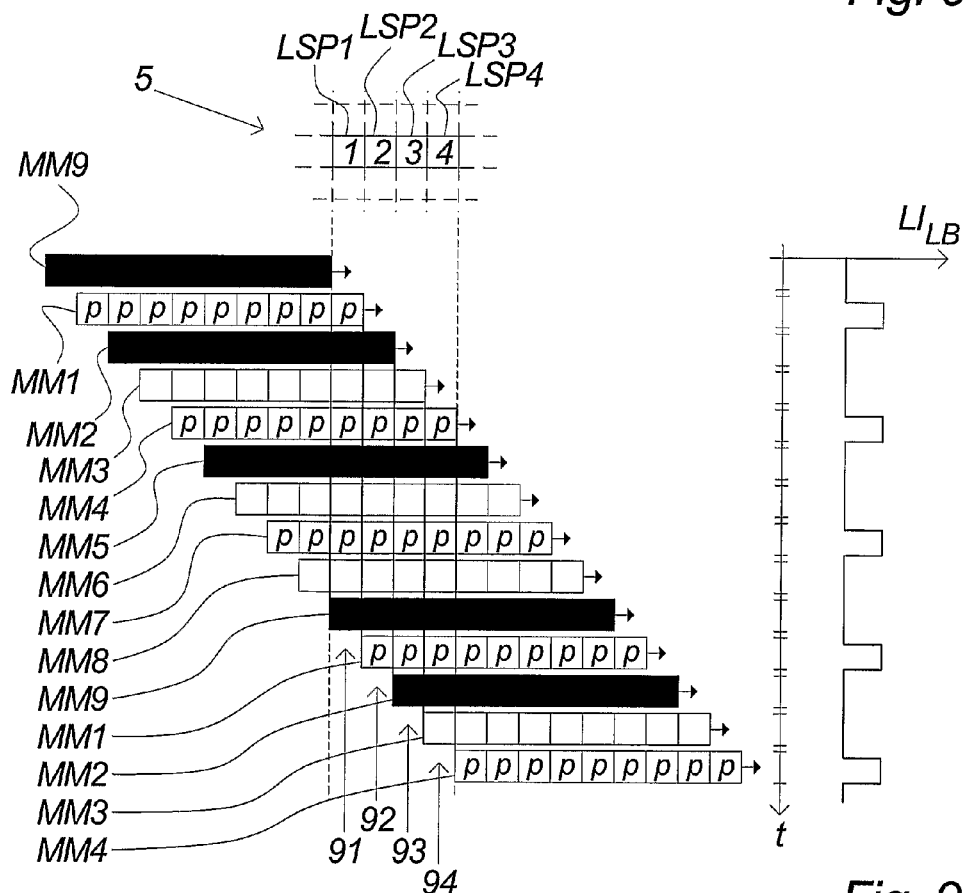
Figure 9C:
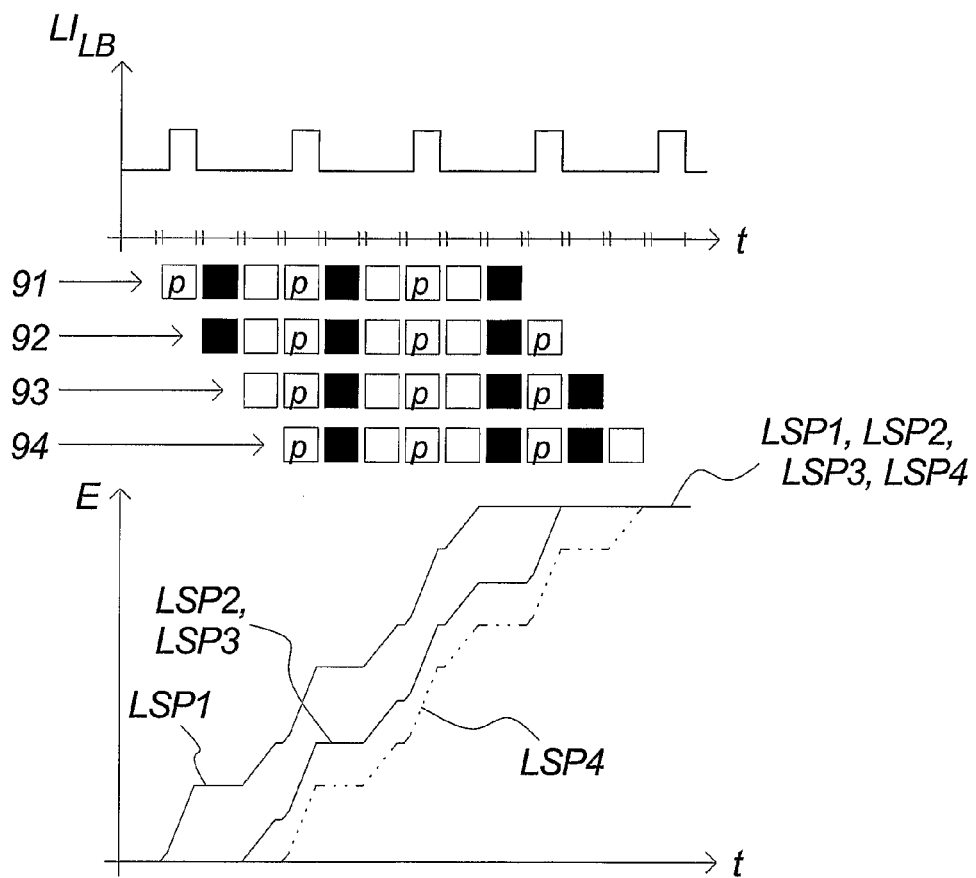

FIG. 2B illustrates movement of the light modulation layout relative to a medium, FIG. 3A illustrates timing diagrams of the light source, FIG. 3B illustrates further timing diagrams of the light source, FIG. 4 illustrates disadvantages of known techniques, FIG. 5 illustrates the effect of an embodiment of the present invention, FIG. 6 illustrates measuring of intensity distribution over a light modulation layout, FIGS. 7A-7C illustrate examples of modulation masks, FIG. 8A illustrates a further example of a modulation mask, FIG. 8B illustrates moving the modulation mask over a medium, FIG. 8C illustrates the result of illumination on the basis of the modulation mask, FIG. 9A illustrates a bank of modulation masks, FIG. 9B illustrates circulating through the mask bank during exposure, and FIG. 9C illustrates a result of illumination on the basis of a modulation mask bank.

DETAILED DESCRIPTION

Figure 1A:
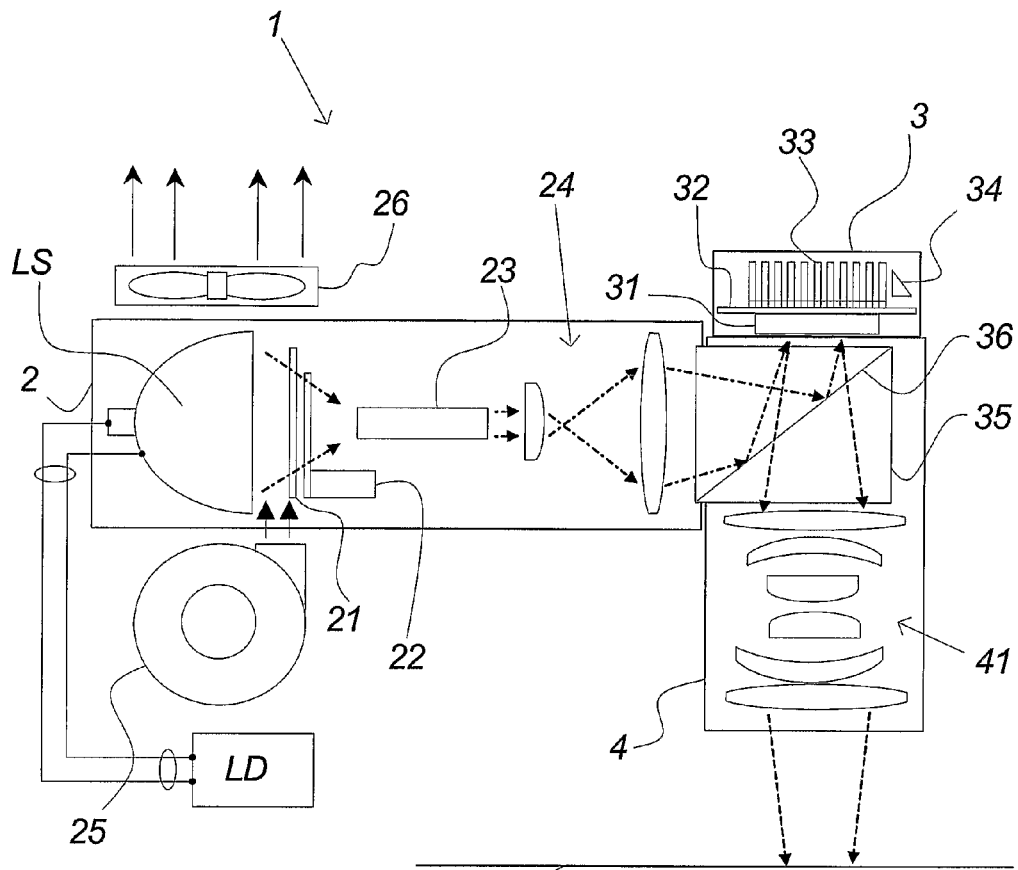
FIG. 1A illustrates an embodiment of a light modulating arrangement.
Figure 1B:
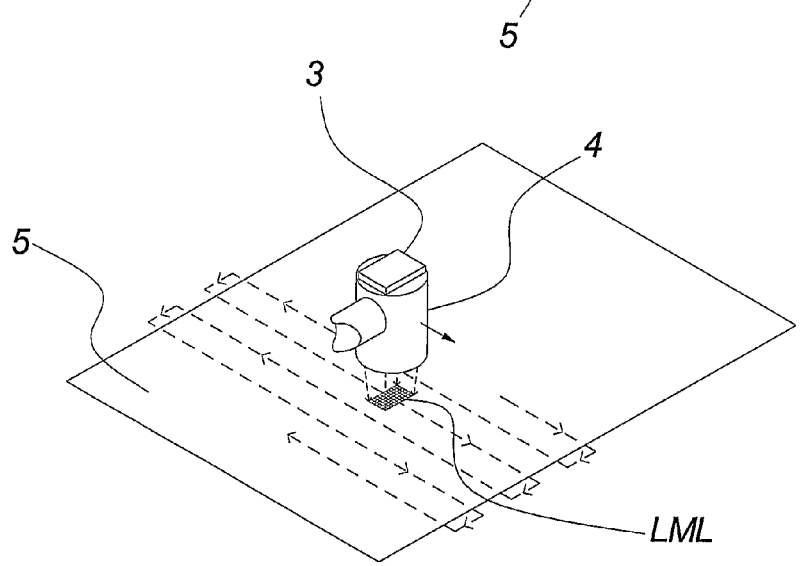
FIG. 1B illustrates a preferred movement pattern of the arrangement.

FIGS. 1A and 1B illustrate a preferred application of the present invention. FIG. 1A illustrates a light modulating arrangement 1 used for photolithography purposes, i.e., typically for exposing printing plates. A first part 2 of the arrangement 1 produces a focused and uniform beam of light. It comprises a light source LS, a lamp driver LD, a blower 25 and a fan 26, a protection glass and filter 21, a shutter 22, a light-integrating rod 23 and beam shaping optics 24.

The type of light source LS depends, among other things, on the type of plate to be exposed. Possible types comprise conventional short arc bulbs, laser sources, diode arrays and more. A preferred conventional lamp may have a power consumption of 270 W but the present invention is not in any way limited to this value or to the mentioned types of lamps. Alternatives such as 250 W and 350 W may, e.g., be considered.

The light from the light source LS is transmitted through a filter (e.g., IR or UV-filter depending on the application) 21 functioning as an interference filter and through a shutter mechanism 22 making it possible to turn off the light beam without turning off the lamp. This is important, as most lamp types need some time after start before they are stabilized. A blower 25 and a fan 26 ensure the cooling of the lamp LS.

Subsequently, the light beam is transmitted through a light-integrating rod 23. Thereby, the light is mixed, making the light throughout the beam uniform with regards to intensity. This ensures that the light in the periphery of the beam has substantially the same intensity as the light in the center of the beam. After the light leaves the light-integrating rod 23, it is focused by beam shaping optics 24.

The next part of the arrangement 1 modulates the light beam to reflect electronically stored image data. It comprises a light-modulating means 3 and means 35 for directing the unmodulated light beam towards the light-modulating means 3 without disturbing its modulated light beam output.

Suitable light-modulating means 3 comprises micro-mirror spatial light modulators, e.g., DMD modulators or GLV modulators, transmissive shutter spatial light modulators, including LCD and micro-mechanical shutters and more. For the preferred embodiment of FIG. 1A, a DMD light-modulating chip 31 is mounted on a PCB 32 with a cooling plate 33 and a temperature sensor 34.

The light directing means 35 depends on the type of light-modulating means 3 used. For transmissive light modulating means, the unmodulated light beam is directed towards one side of the light modulating means, and the modulated light beam is emitted from the other side. In such an arrangement, the light directing means 35 may be excluded.

For DMD modulators, the unmodulated light beam is directed towards the same point as where the modulated light beam is emitted. This necessitates the use of light directing means 35. In the preferred embodiment of FIG. 1A, a TIR-prism is used for light directing means. TIR is an abbreviation meaning 'Total Internal Reflection'.

A TIR-prism comprises a surface 36 which will act as a mirror to light coming from one direction (from the left for this specific embodiment) and will let light coming from another direction (from the top for this specific embodiment) straight through.

The last part of the arrangement 1 focuses the multiple modulated light beams emitted from the light modulating means 31 through the light directing means 35 on an illumination surface 5, e.g., a printing plate. It comprises a set of lenses/a macro lens 41 located within a housing 4.

FIG. 1B illustrates how the light modulating arrangement 1 of FIG. 1A may be used for exposing a printing plate or other kind of light sensitive media 5. Due to clearance, only the light modulating means 3 and lens housing 4 of the arrangement 1 is shown in FIG. 1B. Furthermore, the figure shows a light modulation layout LML established by the light modulating arrangement on the surface of the light sensitive media 5. In order to expose the whole light sensitive media 5, the light modulation layout LML, and thereby the light modulating arrangement 1, and the light sensitive media 5 must be moved with respect to each other in such a way that the light modulation layout eventually has covered the part of the plate that needs to be exposed. This is preferably done by facilitating a scanning movement, e.g., as indicated by the dashed lines, of the light modulation arrangement with respect to the plate, e.g., by letting the light modulation arrangement scan the width of the plate, then move the plate one step forward along its length, then perform a second scan in the opposite direction as before, and so forth.

It is noted that the present invention has several further uses than described above with reference to FIGS. 1A and 1B. It may, furthermore, advantageously be used, e.g., for exposing printed circuit boards in connection with the manufacture of such boards, rapid prototyping, i.e., manufacture of three-dimensional models by a process well-known as rapid prototyping, exposing offset plates and films and, e.g., in serigraphy applications, in photo finishing processes, in biomedical applications, e.g., for research regarding DNA profiles, in projection applications and signs, in digital cinema applications, etc., and in any other application or process comprising light sources and where accurate control of the energy transmitted to a light sensitive media is important.

The light source LS is preferably a short arc lamp, i.e., a high-pressure discharge lamp, and will in the following be treated as such even though it, within the scope of the present invention, may be any light-emitting device comprising, e.g., incandescent lamps of any type, fluorescent lamps, light emitting diodes (LEDs), laser emitters, etc. The short arc lamp may be of any type, e.g., metal halide lamps, mercury vapor lamps or sodium vapor lamps, etc. and is preferably an alternating current (AC) lamp but may as well within the scope of the invention be a direct current (DC) lamp or a lamp with more sophisticated power requirements. The light source is preferably provided with one or more reflectors or other light direction means in order to establish a light beam with as high luminous intensity as possible.

The lamp driver LD may be any kind of power supply suited to drive the particular light source. In the case of a short arc lamp as light source, the lamp driver LD preferably establishes an alternating current (AC) with peaking in order to extend the lifetime of the lamp and stabilize the position of the arc. Alternatively for a suitable short arc lamp, the lamp driver LD may establish a direct current (DC) with peaking or otherwise varying current or voltage, e.g., saw-tooth shaped. The lamp driver LD is preferably a current source but may as well within the scope of the invention be a voltage source.

FIG. 2A illustrates an exemplary light modulation layout LML. It comprises a two-dimensional array of light modulation points LMP. The array comprises a number of rows RO-R1023 and a number of columns C0-C767. The exact number of rows and columns may be anything and is for this specific example chosen to be 1024 rows and 768 columns, corresponding to XGA resolution. Thus, the light modulation layout LML of this example comprises 786.432 light modulation points LMP. Another preferred example is to have 1280 rows and 1024 columns, corresponding to SXGA resolution, or 1280 rows and 720 columns, corresponding to an HD resolution.

It should be noted that the use of the terms rows and columns in this patent application may differ from the use in other application. e.g., concerning displays or monitors. Particularly, the use of the terms is swapped in some applications.

Each light modulation point LMP corresponds to a light modulator LM, e.g., a micro-mirror, of the light modulating means 3, e.g., a DMD chip. The content, e.g., light or not light, of each light modulation point LMP directly corresponds to the setting of the corresponding light modulator LM, and as each light modulator LM may be individually controlled by the light modulating means 3, each light modulation point LMP may correspondingly be individually established by the light modulation means 3. In a preferred embodiment of the light modulating arrangement, only the existence of light in each light modulation point LMP is controlled by the light modulating means 3 but it is within the scope of the invention to also let the light modulating means control other parameters of the light as e.g., the intensity or the wavelength (color) etc.

In a preferred embodiment of the light modulating arrangement of FIG. 1A, the light modulating means 3 comprises a DMD light-modulating chip 31. The surface of the chip, which is exposed to the unmodulated light beam, is covered by hundreds of thousands or millions of small mirrors, arranged in a two-dimensional array. Typically, a chip comprises 1024×768 mirrors or 1280×1024 mirrors. Each mirror constitutes a light modulator LM and is able to direct the incoming light in two directions. A first direction towards the optics 41 and the light sensitive media 5, and a second direction towards some light absorbing material. Thus, the modulated light beam actually consists of many sub beams, each being reflected from one of the small mirrors. By controlling the direction of each mirror, i.e., light modulator LM, it is possible to control which of the light modulation points LMP of the light modulation layout LML that receives light at a specific time.

Several other embodiments of light modulation arrangements, light modulation means, etc., e.g., the use of micromechanical shutters, more than one light modulation means, different movement patterns, etc., within the scope of the present invention, are disclosed in the PCT patent application published as WO 2004/021269, hereby incorporated by reference.

In the following description, when mentioning a light modulator LM being turned on or off, it indicates whether or not it illuminates its corresponding light modulation point LMP. Furthermore, the present invention is in the following described in the context of a light modulating arrangement according to FIG. 1A, comprising a DMD spatial light modulator, establishing a light modulation layout LML according to FIG. 2A and exercising a movement pattern according to FIG. 1B. It is, however, noted that any light modulating arrangement comprising any light modulating means, establishing any kind of light modulation layout and exercising any movement pattern is within the scope of the present invention.

FIG. 2B shows how the movement pattern of FIG. 1B causes each point LSP on the light sensitive media to be exposed to the possible light of several light modulators LM. It is noted that the reference to points on the light sensitive media does not necessarily refer to physically defined points on the media but rather to points logically defined by the light modulation layout LML. Hence, the light sensitive media may actually have point resolutions of significantly smaller size, e.g., molecule size, than the points relevant to the present description.

Due to reasons of clarity, the light modulation layout LML is shown with much fewer light modulation points LMP as in a preferred embodiment. As the light modulating arrangement, and thereby the light modulation layout LML, moves over the light sensitive media 5 in the direction indicated by the arrow, each point on the light sensitive media possibly receives light from several light modulators but always from light modulators located in the same row. For example, the specific light sensitive point LSP on the light sensitive media receives light only from the light modulators located in the row R2, which are on at the time they are over that point LSP. When the light modulation layout has moved over the specific point LSP, that point has altogether received energy corresponding to a time-based accumulation of the light intensity from each light modulator in the row R2 that is turned on. Each point may, however, receive light from more than one row of light modulators LM if an overlapping movement pattern is used, or if the light modulating arrangement comprises more than one light modulating means.

In an alternative embodiment within the scope of the present invention, the light modulation arrangement 1, and, thus, the light modulation layout LML, may move stepwise over the light sensitive media 5, each step being preferably the width of the light modulation layout LML.

Thereby, each light sensitive point LSP is only illuminated once and only by one light modulator LM. The energy accumulation does, thus, in this alternative embodiment not depend on the number of light modulators illuminating it by a scanning movement but rather of the time span the one light modulator is positioned (and turned on) over a specific light sensitive point.

It is noted that combinations of the scanning and step movement patterns and any other moving and illumination patterns are within the scope of the present invention.

Typically, the light sensitive medium 5, e.g., a printing plate, is by means of, e.g., a DMD-based light modulation arrangement 1 exposed to a desired image by looping through an algorithm comprising the steps of: (1) on the basis of digitally stored information about the full or partial image to expose, establishing a bitmap comprising settings for each of the light modulators LM for the current relative position between the light modulating arrangement 1 and the light sensitive medium 5, (2) loading the established bitmap into the DMD-chip internal memory, (3) instructing the DMD-chip to engage the light modulators LM according to the loaded data, (4) after a certain time determined on the basis of, e.g., the scanning speed, peak timing, etc., instructing the DMD-chip to disengage the light modulators LM.

It is noted that the above example algorithm is merely provided in order to ease the following description, and that any algorithm is within the scope of the present invention. It is, furthermore, noted that the above algorithm is designed for use with DMD-based light modulating arrangements and, thus, may not work with other light modulating means without modifications. Such modifications may, however, typically be retrieved or determined fairly easily from the manuals corresponding to the specific light modulation means.

Also, in order to clarify the following description of the invention, the above-mentioned desired image is in all following examples chosen to be an image that will in itself cause all light modulators to be turned on, i.e., an all-white or all-black image depending on the media type, either negative or positive. By choosing such an image for the examples, the characteristics of the light modulation arrangement, the DMD, the specific embodiments, etc., stand out more clearly than when blurred by an example image. Thus, the following illustrations, values, etc., may only be true for this specific test image whereas the principles are true for any applied image.

FIGS. 3A and 3B illustrate problems that may follow using a lamp that requires AC power with peaking as described above. FIG. 3A comprises timing diagrams of the voltage $V_{LS}$ and current $I_{LS}$ that in one embodiment of the invention is applied to the light source LS. In the shown example, the lamp driver establishes an alternating current with peaking. The lamp driver outputs an alternating current $I_{LS}$ that, in addition to a positive and negative current floor CF value, comprises current peaks CP prior to each direction shift. The voltage $V_{LS}$ over the lamp alternates in the shown example between a positive and a negative voltage floor VF value, and comprises voltage peaks VP in correspondence to the current peaks. Both the voltage and the current waveforms are preferably square waves to ensure only very short periods of voltages in the region of the ground potential, usually 0V. Because of the current peaks CP, the electrical power consumed by the light source will not be constant as the power may be evaluated as the product of the RMS current and the RMS voltage.

Examples of actual values in the case of a short arc lamp driven by AC with peaking, may comprise a voltage floor VF of, e.g., 77-140 volts, a current floor CF of, e.g., 1.7-3.3 amperes, current peaks CP of, e.g., 150-200% of the current floor CF value, a $V_{SAL}$ period time of e.g., 3-10 ms, and current peaks CP having a duration of, e.g., 200-600 µs. It is noted that the present invention is in no way restricted to the values, waveforms, etc., mentioned above. An often-used alternative timing scheme for short arc lamps is a direct current scheme with saw-tooth shaped current.

It is well known within the art that applying current peaks to a short arc lamp significantly improves its usability within precision applications as the position of the arc becomes less fluctuating and, thereby, also the point of light emission.

FIG. 3A further illustrates the resulting luminous intensity $LI_{LB}$ of the light beam established by the light source LS. As the luminous intensity is derived from the consumed electrical power, it comprises an intensity floor IF being proportional with the multiple of the voltage floor VF and the current floor CF and intensity peaks IP inherited from the current peaks CP having a value proportional with the multiple of the voltage floor VF and the current peak CP. The intensity peaks IP are, thus, a trade off for improved precision but are, nevertheless, unacceptable in many applications where a substantially constant luminous intensity is necessary.

The diagram of $LI_{LB}$ clearly illustrates one problem that the present invention may address. As the luminous intensity of the light beam LB comprises intensity peaks IP, any area exposed to the light beam LB will experience inconstant illumination. While this may be acceptable for some applications, e.g., projectors where the light beam is used to illuminate the same area continuously, it is not acceptable for applications within several areas as, e.g., photolithography and other techniques where the region to be exposed is only illuminated little by little. This is because the human eye is better to judge the relative intensities of, e.g., two dots established individually and presented side by side than intensity changes of one dot. Additionally, the periodicity of the intensity peaks may, in unfortunate incidents, cause stripes or other visible periodical patterns to occur.

Whereas FIG. 3A illustrates a continuous problem that may follow from using peaked AC lamps, FIG. 3B illustrates a further problem that is derived from the above, but only becomes significant over a considerable time. The timing diagram of FIG. 3B corresponds in many ways to the timing diagram of FIG. 3A, yet the time axes, however, have been extended far beyond those of FIG. 3A. The far longer time period is indicated by the breaks on each time axis. Each break corresponds to several hours, e.g., 200 hours.

The first diagram illustrates the voltage $V_{LS}$ over the light source LS. It is a square waveform as in FIG. 3A but the voltage floor VF increases with time of use. This is caused by the electrode gap of the short arc lamp slowly growing wider during use because of displacement of electrode material. A wider gap necessitates a higher voltage in order for the electrons to jump the gap and, thus, establishes the light-emitting arc.

As the power consumed by the light source should be substantially fixed in order for the luminous intensity of the light beam to be constant, the increase in electrical resistance represented by the electrode gap causes an increase in voltage and a decrease in current, as the power is determined by the multiple of the voltage and the current. The second diagram of FIG. 3B shows three snapshots of the light source current $I_{LS}$ at different times during use. It is seen that the current floor CF decreases as the voltage floor increases. The current peaks CP are, however, maintained at a constant value as the lamp driver LD rather than the power dissipation of the light source LS determines that specific value.

The third diagram of FIG. 3B illustrates the luminous intensity of the light beam $LI_{LB}$ established by the light source on the basis of the voltage and current schemes of FIG. 3B. As the luminous intensity is proportional with the electrical power, the intensity is maintained at a constant level indicated by the intensity floor IF, whereas the intensity of the intensity peaks IP increases due to its correspondence with the multiplication of an increasing voltage with a constant current.

FIG. 4 illustrates how the intensity peaks IP comprised by the light beam may influence the energy accumulated in each light sensitive point LSP of the media 5. It comprises, at the top, a copy of the last diagram of FIG. 3B, i.e., a timing diagram of the intensity of the light beam established by the light source. Underneath that, i.e., sharing the time axis with the light intensity diagram, is a diagram of the energy E accumulated in three subsequent light sensitive points LSP1, LSP2, LSP3. The diagram, thus, illustrates the result of moving the light modulating arrangement 1 over the three light sensitive points LSP1, LSP2, LSP3. Underneath the time axis, the time spans are indicated in which each point is exposed, i.e., the time it takes the light modulation layout LML to pass over the points. As the curves show the accumulated energy, the slope of the curves are steeper during intensity peaks of the light beam. As seen from the diagram, three intensity peaks occur during the exposure of the first light sensitive point LSP1, only two peaks occur during the exposure of the next light sensitive point LSP2, and about two and a half peaks occur during the exposure of the third light sensitive point LSP3. Thereby, the energy accumulated in the first point LSP1 is higher than the energy accumulated in the third point LSP3, which again is higher than the energy accumulated in the second point LSP2.

For several applications, e.g., photolithography, the energy differences, however small they may be, may easily cause unacceptable results, e.g., periodic stripes on a printing plate, etc. The problem is closely connected to the relation between the frequency of the intensity peaks and the scanning speed of the light modulation layout. If, e.g., several hundreds of peaks occur within the exposure of each light sensitive point LSP, one or two more or less may not cause unacceptable energy differences. But typically the desirable peak frequency and the desirable scanning speed is related in such a way that the problem is significant and unacceptable.

In an embodiment of the present invention, synchronizing the scanning speed with the peak frequency solves the problem. This solution is shown in FIG. 5. The scanning speed is adjusted in such a way that the exposure time for one light sensitive pixel corresponds to exactly an integer number of peaks, e.g., three peaks as in the example of FIG. 5. Thereby, the accumulated energy in each light sensitive point LSP1, LSP2 and LSP3 is the same as shown in FIG. 5.

The synchronization between the scanning speed and the peaks may be established by measuring or otherwise determining the exact peak frequency and adjusting the scanning speed according to that, or oppositely by measuring or otherwise determining the scanning speed and adjusting the peak frequency according to that. In another embodiment of the invention, the peak frequency and scanning speed are both variables and may be adjusted during exposure as long as the synchronization between them are maintained. Alternatively, or in combination with the above, the synchronization may be established by adjusting the number of columns of the light modulation layout, i.e., its width. As light modulating means, e.g., DMD-chips, are typically only manufactured in a few different dimensions, adjusting the width of the light modulation layout may in practice be done by choosing a modulation means, e.g., a DMD-chip, which is too wide and then just use a part of its width.

More advanced light modulating arrangements or other means for illuminating more than one point at a time comprise means for compensating intensity variations in the cross section of the light beam or anything else that may distort the intensity uniformity over the light modulation layout. Actually, due to limitations in the optical design, the light modulating means, etc., the light intensity distribution over the light modulation layout is typically not uniform and the distortion is typically not linear or symmetrical either. Usually the light intensity is highest in or somewhere near the middle of the light modulation layout and it is lowest and most distorted in the corners. In order to compensate for that non-uniformity, filters or masks are introduced.

A brief description of one method to determine the actual intensity distribution is given with reference to FIG. 6. It comprises an example light modulation layout LML that is moved by a scanning movement over a measuring line 61. The measuring line may, e.g., comprise a column of intensity or energy meters, one for each row of the light modulation layout. The results from the measuring line 61 may be used to establish a diagram as shown on the right in FIG. 6. It comprises the accumulated energy E for each row. Thereby, it is possible to determine the least intense row and use its accumulated energy potential as a common denominator for all rows indicated by the dashed line 62. If no row submits more energy to an individual light sensitive point than the determined common denominator 62, or an even lower level for safety or other reasons, a uniform intensity distribution may be achieved.

In order to force all rows to only submit the energy corresponding to the least intense row, or even less, masks are established. FIGS. 7A to 7C illustrate a few of several possible modulation masks MM for use with a light modulating arrangement for counteracting the non-uniform intensity distribution. The arrows indicate the intended traveling direction, i.e., the direction along the rows of the light modulation layout. A mask indicates a number of light modulators, e.g., micro-mirrors, which should be turned off in order to not exceed the determined common denominator 62, or a lower safe level. In FIGS. 7A to 7C, the black areas denote light modulators that should not be used. Clearly the masks in these figures are intended to compensate for a distribution pattern where the intensity is highest in the center and decreases towards the edges, also illustrated in FIG. 6, by allowing more light modulators to be applied in the top and bottom rows than in the middle rows. The FIGS. 7A and 7B illustrate fairly simple masks that do not take into account the possible distortion along the rows of the light modulation layout, whereas FIG. 7C illustrates a more advanced mask pattern where the blocked light modulators are distributed heterogeneously or pseudo-randomly or randomly along the rows. This last embodiment also compensates for the distortion along the rows as each row will use light modulators from the edge-areas as well as the center area for illuminating each light sensitive point.

Regarding the algorithm described above, the use of masks causes an additional step to be inserted, such that typically the light sensitive medium 5, e.g., a printing plate, is by means of, e.g., a DMD-based light modulation arrangement 1, exposed to a desired image by looping through an algorithm comprising the steps of: (1A) on the basis of digitally stored information about the full or partial image to expose, establishing a bitmap comprising settings for each of the light modulators LM for the current relative position between the light modulating arrangement 1 and the light sensitive medium 5, (1B) establishing a composite bitmap by combining the established bitmap with a modulation mask MM by means of a bitwise AND-operations, (2) loading the established composite bitmap into the DMD-chip internal memory, (3) instructing the DMD-chip to engage the light modulators LM according to the loaded data, (4) after a certain time determined on the basis of, e.g., the scanning speed, peak timing, etc., instructing the DMD-chip to disengage the light modulators LM.

It is yet again noted that the above example algorithm is merely provided in order to ease the description, and that any algorithm is within the scope of the present invention. It is, furthermore, noted that the above algorithm is designed for use with DMD-based light modulating arrangements and, thus, may not work with other light modulating means without modifications. Such modifications may, however, typically be retrieved or determined fairly easily from the manuals corresponding to the specific light modulation means.

A more thorough description of the use of masks, how to determine the intensity distribution, parameters to take into account when designing the masks, as well as several different embodiments attacking the issue, are disclosed in the PCT patent application published as WO 2004/021269, hereby incorporated by reference.

Turning back to the problem of intensity variations due to light beam intensity peaks, the embodiment described above with reference to FIG. 5 may not work when masks as described above are used for compensating for non-uniform intensity distribution over the light modulation layout. This is because this embodiment implies the use of all light modulators, e.g., micro-mirrors, in each row, or at least the same number of modulators in each row. When a different number of light modulators, or differently positioned light modulators, are used in each row, it is likely that for some rows the unused light modulators pass over a certain light sensitive point at the time of a peak, whereas the unused modulators in other rows pass over a corresponding light sensitive point at the time of an intensity floor.

The problem is illustrated in FIGS. 8A to 8C. In FIG. 8A is shown an example of a modulation mask MM due to clarity again only comprising a fraction of the rows and columns typically comprised. As regards FIGS. 7A-7C, the black pixels are blocked, i.e., forcing the corresponding light modulators LM to stay turned off. FIG. 8B illustrates the movement of the light modulation layout over the light sensitive medium 5, e.g., a printing plate. It comprises a fraction of a light sensitive medium 5 showing four light sensitive points LSP1, LSP2, LSP3 and LSP4 positioned adjacent to each other in the same row on the plate. In the right side of FIG. 8B is shown an intensity peak timing diagram, having a vertical time axis and a horizontal intensity axis. The vertical time axis comprises marks showing the illumination time for each light sensitive point and the pauses between the light modulator engagements.

Furthermore, FIG. 8B illustrates the traveling of one modulation mask row MMR over the four light sensitive points by illustrating the position of the modulation mask row at different times corresponding to the vertical time axis. The modulation mask row MMR is in this example the fourth row of the modulation mask MM of FIG. 8A. At times where an intensity peak occurs, a "p" is written on the modulation mask row in order to ease reading of the diagram.

In the present illustration, the scanning speed is synchronized with the peak frequency as in the embodiment of FIG. 5. As the mask row moves over the light sensitive points, these are illuminated by standard intensity, illuminated by peak intensity, or blocked. The actual illumination may, thus, be determined from combining the mask, the scanning speed and the peak timing. Each of the columns 81, 82, 83, 84 below the light sensitive points, thus, comprises the individual exposures of each point at different times. It may, e.g., be seen that the first light sensitive point LSP1 has been exposed to standard intensity three times, to peak intensity three times, and to no light three times. Analogously, the second light sensitive point has been exposed to standard intensity four times, to peak intensity twice because of the coincidence between a peak and a blocking, and to no light three times. The third light sensitive point has been exposed to standard intensity five times, to peak intensity only once because of the coincidences between the peaks and blockings, and to no light three times.

FIG. 8C comprises a diagram showing the energy accumulation taking place. It again comprises an intensity peak timing diagram corresponding to a horizontal time axis. Below the time axis, the columns 81, 82, 83 and 84 of FIG. 8B are shown but they have been rotated 90 degrees corresponding to the time axis. It is, thus, possible to see from FIG. 8C what is experienced by each light sensitive point LSP1, LSP2, LSP3 and LSP4 and at which times. Below that, an energy diagram shows the accumulation of energy for each light sensitive point as determined from the experience columns 81, 82, 83, 84. Clearly, the different points attain different energy levels because of the different number of peaks experienced by each point, even though the scanning speed is actually synchronized with the peak timing in the present example.

In order to overcome the problem of the modulation mask coinciding with the intensity peaks for some light sensitive points, the mask is in a preferred embodiment of the invention adapted so that it is locked to the peak timing rather than to the scanning movement, thereby ensuring that if one light sensitive point receives an intensity peak due to the mask, all light sensitive points will receive that peak, and if a peak is blocked regarding one light sensitive point due to the mask, no light sensitive points receive that peak. FIGS. 9A to 9C are provided to illustrate this.

Instead of moving the mask with the light modulation layout LML, the mask is now fixed to the time, i.e., to the peak timing, and, thus, actually also to the light sensitive media when taking the scanning speed into account. In order to ensure that an intensity peak is either absorbed by all or none of the light sensitive points within a row, it is necessary to treat all light modulators within that row equally at the peak times, i.e., either turned on or off. As turning all light modulators off all the time obviously causes no exposure to happen, and turning all light modulators on all the time obviously causes the use of masks against non-uniform distribution impossible, a runtime adaptation of the mask is a possibility. This may comprise either establishing a bank of different masks to use at different times or establishing an algorithm from which it is possible to always establish a mask that corresponds to the current time.

Several possible mask adaptation patterns may be used in order to obtain the row-wise common acceptance or rejection of peaks. FIG. 9A illustrates one such possible scheme. As the primary objective of using a modulation mask as, e.g., the example shown in FIG. 8A, is to ensure uniform energy accumulation for all rows, a mask row comprising, e.g., three blocked light modulators out of nine may as well be implemented by blocking all of that row's light modulators during three out of nine illumination periods and turning all light modulators on for the remaining six periods. FIG. 9A comprises nine modulation masks MM1, MM2 . . . MM9. The modulation masks have been inspired by the modulation mask of FIG. 8A in such a way that applying the mask of FIG. 8A repeatedly for nine illumination periods equals applying each of the modulation masks MM1 to MM9 once. All columns of the first modulation mask MM1 of FIG. 9A are, thus, equal to the right-most column of the mask of FIG. 8A, all columns of the modulation mask MM2 are equal to the second right-most column of the mask of FIG. 8A and so on. Thereby, it is ensured that the uniform intensity distribution facilitated by the mask of FIG. 8A is maintained while the intensity peaks are also handled.

FIG. 9B corresponds to FIG. 8B except for the contents of the modulation mask row that is moved over the light sensitive points. As the modulation mask in the present embodiment of the invention actually comprises a bank of modulation masks MM1 . . . MM9, the modulation mask row in FIG. 9B is changed for each illumination period as indicated by the references MM1 . . . MM9. The columns 91, 92, 93, 94 again contain the intensities experienced by each of the light sensitive points LSP1, LSP2, LSP3, LSP4. By the modulation mask adaptation technique of the present embodiment, it is ensured that all light sensitive points experience the same amount of light at each illumination period. Thereby, it is also ensured that, in the present example, all points receive three standard intensity exposures, three peak intensity exposures, and three exposures without light.

FIG. 9C comprises a diagram corresponding to that of FIG. 8C showing the energy accumulation taking place. Contrary to the example of FIG. 8C, the light sensitive points in this example, however, absorb exactly the same amount of energy.

From this diagram, it is also evident that the blocked light modulators, i.e., the modulation mask has been synchronized with and locked to the time and the intensity peaks instead of the light modulation layout.

Regarding the algorithm described above, the use of masks for compensating intensity peaks as described above with reference to a preferred embodiment of the present invention causes an additional step to be inserted such that typically the light sensitive medium 5, e.g., a printing plate, by means of, e.g., a DMD-based light modulation arrangement 1, is exposed to a desired image by looping through an algorithm comprising the steps of: (1A) on the basis of digitally stored information about the full or partial image to expose, establishing a bitmap comprising settings for each of the light modulators LM for the current relative position between the light modulating arrangement 1 and the light sensitive medium 5, (1Aa) establishing, by loading and/or processing, a modulation mask MM, (1B) establishing a composite bitmap by combining the established bitmap with a modulation mask MM by means of a bitwise AND-operations, (2) loading the established composite bitmap into the DMD-chip internal memory, (3) instructing the DMD-chip to engage the light modulators LM according to the loaded data, (4) after a certain time determined on the basis of, e.g., the scanning speed, peak timing, etc., instructing the DMD-chip to disengage the light modulators LM.

It is noted that the bank of masks illustrated in FIG. 8A is merely an example and that any scheme or method of determining, establishing or adapting the modulation masks, whether at runtime or preceding the exposure, are within the scope of the present invention. It is, furthermore, noted that the timing of mask adaptation does not necessarily need to correspond to the illumination periods, scanning speed, etc., but may be determined on the basis of any parameters.

In a preferred embodiment of the invention, the modulation mask or bank of masks is optimized to never turn off light modulators at peak times. This is to actually exploit the extra energy comprised by the intensity peaks and, thus, benefit from the otherwise annoying and problematic peaking power supply. It is, however, noted that also modulation masks blocking some or all of the peaks are within the present invention.

A further embodiment of the present invention comprises a light modulating arrangement comprising a spatial light modulator and the use of modulation masks for avoiding non-uniform intensity distribution over the light modulation layout. In order to enable the use of peaked light sources, the modulation masks are, during scanning, shifted in a direction along or opposite the scanning direction, by an amount of one or more light modulator widths. Thereby, the modulation mask may be synchronized with and locked to the intensity peaks.

Due to clarity, the intensity peaks have, in the above examples, been of a width approximately corresponding to the width of one illumination period, i.e., the time it takes for the light modulation layout to move from the edge of one light sensitive point to the edge of the next point. The peaks are, however, typically not related to the other parameters at all and any correspondence between the frequency and width of the intensity peaks and the illumination periods, the scanning speed, etc., is within the scope of the present invention.

The further problem by using light sources with peaking power supplies described above with reference to FIG. 3B, i.e., the problem of the difference between the intensity floor level and the intensity peak level changing over a considerable time, e.g., significantly over 200 hours, is also addressed by the above-described embodiments of the present invention as such changes are insignificant as long as the peaks are either fully exploited for all light sensitive points or fully silenced for all light sensitive points, e.g., by blocking light modulators at peak times.

An alternative embodiment of the present invention is primarily directed against light modulating arrangements exercising a stepping movement pattern instead of a scanning movement pattern. When such a movement pattern is used, each light sensitive point LSP is illuminated for a certain time by one light modulator LM which is positioned steadily over the light sensitive point. The illumination may be repeated by the same or a different light modulator LM, and for the same or a different amount of time. The energy accumulation does, thus, in this alternative embodiment, not primarily depend on the number of light modulators illuminating it during a scanning movement but rather of the time span the one light modulator is positioned (and turned on) over a specific light sensitive point. Thereby, the use of constant modulation masks is impossible as a blocked light modulator would cause no light at all to reach the corresponding light sensitive point.

In order to overcome this, an embodiment of the present invention comprises changing the modulation mask during exposure. The changes may be applied at a certain frequency or at any possible time, and may comprise periodic, pseudo random or random enabling and disabling of light modulators. The change timing and matter should preferably be synchronized with the intensity peak timing. A certain embodiment of this may also be described as a pile of modulation masks, whereof at certain times or according to a certain frequency, the uppermost mask is applied, and the formerly applied mask is put in the bottom of the pile. Preferably the application of the first mask should be synchronized with the peak timing.

A variant of this embodiment comprises applying modulation masks to the illumination time spans. By monitoring and/or controlling the intensity peak timing and amount, it is possible to adjust the illumination times, i.e., apply a modulation mask to the times, when intensity peaks occur.

It is noted that the present invention has several further uses than described above. It may, furthermore, with advantage be used, e.g., for exposing printed circuit boards in connection with the manufacture of such boards, rapid prototyping and rapid manufacture, i.e., manufacture of three-dimensional models by a process well-known as rapid prototyping or rapid manufacture, exposing offset plates and films, in serigraphy applications, in photo finishing processes, in biomedical applications, e.g., for research regarding DNA profiles, in projection applications and signs, in digital cinema applications, etc., and in any other application or process comprising light sources and where the possible uniformity of accumulated energy in different points at a light sensitive media may have a certain importance.

The invention claimed is:

1. A method for enabling transmission of substantially equal amounts of energy from at least one light source to at least two light sensitive points, wherein a resulting luminous intensity of the light source is a substantially continuous wave mode and comprises intensity variations in time in the form of substantially periodic intensity peaks, comprising the steps of:

controlling said transmission by at least one illumination arrangement;

establishing a correlation between said intensity variations and at least one feature of said illumination arrangement;

moving said at least one illumination arrangement and said at least two light sensitive points relative to each other, wherein said at least one feature of said illumination arrangement comprises characteristics of said relative movement; and wherein said step of establishing a correlation further comprises adapting said characteristics of said relative movement into synchronism with said intensity variations in time or adapting said intensity variations in time into synchronism with said characteristics of said relative movement, and said synchronism between said intensity variations and said characteristics of said relative movement comprise an integer number of said periodic intensity peaks to occur during the illumination of each of said at least two light sensitive points.

2. The method of claim 1, wherein said illumination arrangement comprises at least one light modulation system, and said at least one feature of said illumination arrangement comprises characteristics of said light modulation system.

3. The method of claim 2, wherein said at least one light modulation system comprises at least one spatial light modulator comprising a plurality of light modulators.

4. The method of claim 2, wherein said controlling of said transmission by said at least one illumination arrangement comprises controlling said characteristics of said at least one light modulation system at least partly on the basis of at least one modulation mask defining light modulators to be disabled.

5. The method of claim 4, wherein said establishment of a correlation comprises adapting said at least one modulation mask so that said characteristics of said at least one light modulation system is controlled in synchronism with said intensity variations in time.

6. The method of claim 5, wherein said adapting of said at least one modulation mask is performed continuously.

7. The method of claim 5, wherein said adapting of said at least one modulation mask comprises choosing a predefined modulation mask from a bank of modulation masks.

8. The method of claim 4, wherein said at least one modulation mask further comprises control information for avoiding non-uniform energy transmission due to intensity variations in space caused by said light modulation system or optical features of said illumination arrangement.

9. The method of claim 8, wherein said establishment of a correlation comprises rearranging said control information in time.

10. The method of claim 8, wherein said establishment of a correlation comprises rearranging said control information in space.

11. An illumination arrangement for controlling transmission of energy to at least two light sensitive points, wherein said controlling transmission enables transmission of substantially equal amounts of energy to each of said at least two light sensitive points;

said illumination arrangement comprises at least one light source substantially driven in continuous wave mode;

said at least one light source is adapted to submit light comprising substantially periodic intensity variations;

said illumination arrangement comprises at least one light modulation system comprising at least one spatial light modulation system;

said transmission of substantially equal amounts of energy to each of said at least two light sensitive points is at least partly enabled by controlling relative movement between said illumination arrangement and said at least two light sensitive points; and said controlling of said relative movement comprises synchronizing said relative movement with said periodic intensity variations in such a way that an integer number of said periodic intensity peaks occur during the illumination of each of said at least two light sensitive points.

12. The illumination arrangement of claim 11, wherein said at least one spatial light modulation system comprises a DMD-chip.

13. The illumination arrangement of claim 11, wherein said at least one spatial light modulation system comprises a micro-mechanical shutter array.

14. The illumination arrangement of claim 11, wherein said illumination arrangement is moved relative to said at least two light sensitive points.

15. The illumination arrangement of claim 11, wherein said transmission of substantially equal amounts of energy to each of said at least two light sensitive points is at least partly enabled by controlling said light modulation system.

16. The illumination arrangement of claim 15, wherein said controlling said light modulation system comprises applying at least one modulation mask.

17. The illumination arrangement of claim 16, wherein said at least one modulation mask is established on the basis of characteristics of said periodic intensity variations.

18. The illumination arrangement of claim 16, wherein said at least one modulation mask further comprises control information for handling further disadvantages of said illumination arrangement.

19. The illumination arrangement of claim 18, wherein said controlling of said light modulation system comprises rearranging said control information for handling further disadvantages.

* * * * *